(12) United States Patent
Feigelson et al.

(10) Patent No.: US 12,281,409 B2
(45) Date of Patent: Apr. 22, 2025

(54) BIPOLAR NANOCOMPOSITE SEMICONDUCTORS

(71) Applicant: The Government of the United States of America, as represented by the Secretary of the Navy, Arlington, VA (US)

(72) Inventors: Boris N. Feigelson, Springfield, VA (US); Alexander L. Efros, Annandale, VA (US); Benjamin L. Greenberg, Alexandria, VA (US); Michael Shur, Vienna, VA (US)

(73) Assignee: The Government of the United States of America, as represented by the Secretary of the Navy, Arlington, VA (US)

( * ) Notice: Subject to any disclaimer, the term of this patent is extended or adjusted under 35 U.S.C. 154(b) by 163 days.

(21) Appl. No.: 17/951,181

(22) Filed: Sep. 23, 2022

(65) Prior Publication Data

US 2024/0014263 A1   Jan. 11, 2024

Related U.S. Application Data

(60) Provisional application No. 63/247,819, filed on Sep. 24, 2021.

(51) Int. Cl.
| | | |
|---|---|---|
| *C30B 29/22* | (2006.01) | |
| *H01L 29/66* | (2006.01) | |
| *H01L 29/732* | (2006.01) | |
| *H10D 10/01* | (2025.01) | |
| *H10D 10/40* | (2025.01) | |

(52) U.S. Cl.
CPC ........... *C30B 29/22* (2013.01); *H10D 10/021* (2025.01); *H10D 10/40* (2025.01)

(58) Field of Classification Search
CPC ..................................................... C30B 29/22
See application file for complete search history.

(56) References Cited

U.S. PATENT DOCUMENTS

| | | |
|---|---|---|
| 2011/0024793 A1 | 2/2011 | Jeon |
| 2014/0185640 A1 | 7/2014 | Jain |
| | (Continued) | |

FOREIGN PATENT DOCUMENTS

| | | |
|---|---|---|
| CN | 112687929 | 4/2021 |

OTHER PUBLICATIONS

B.E. Treml et al., "Processing-Structure-Property Relationships in Laser Annealed PbSe Nanocrystal Thin Films," ACS Nano 2015, 9, 4096 4102.

(Continued)

*Primary Examiner* — William D Young
(74) *Attorney, Agent, or Firm* — US Naval Research Laboratory; Scott C. Hatfield

(57) ABSTRACT

A bipolar nanocomposite semiconductor (BNS) material in which electrons and holes are separately transported throughout the BNS volume via an interpenetrating plurality of networks, where some of the networks have one conductivity type and others have the opposite conductivity type. The interpenetrating networks can include one or more multiple nanocrystalline structures, metal and dielectric networks and are intimately connected to enable band-like transport of both electrons and holes throughout the material.

10 Claims, 16 Drawing Sheets

(56) References Cited

U.S. PATENT DOCUMENTS

2016/0315231 A1* 10/2016 Göötz .................. H01L 33/504
2018/0033939 A1    2/2018 Kwon et al.

OTHER PUBLICATIONS

Y. Liu et al., "Robust, Functional Nanocrystal Solids by Infilling with Atomic Layer Deposition," Nano Lett. 2011, 11, 5349-5355.
H. Wang et al., "Air Stable CuInSe2 Nanocrystal Transistors and Circuits via Post Deposition Cation Exchange," ACS Nano 2019, 13, 2324-2333).
D. Lanigan et al., "Contact Radius and the Insulator Metal Transition in Films Comprised of Touching Semiconductor Nanocrystals," ACS Nano 2016, 10, 6744-6752.
B. L. Greenberg et al., "Metal Insulator Transition in a Semiconductor Nanocrystal Network," Sci. Adv. 2019, 5, eaaw1462.
T. Chen et al., "Metal Insulator Transition in Films of Doped Semiconductor Nanocrystals," Nat. Mater. 2016, 15, 299-303.
M. Miyauchi et al., "Selective Growth of N-Type Nanoparticles on P Type Semiconductors for Z-Scheme Photocatalysis," ACS Appl. Mater. Interfaces 2013, 5, 9770-9776.
V. Nguyen et al., "Novel P-n Heterojunction Nanocomposite: TiO2 QDs/ZnBi2O4 Photocatalyst with Considerably Enhanced Photocatalytic Activity under Visible Light Irradiation," J. Phys. Chem. C 2020, 124, 27519-27528).
F. Guo et al., "Nanocomposite Ultraviolet Photodetector Based on Interfacial Trap Controlled Charge Injection," Nat. Nanotechnol. 2012, 7, 798-802.
E. Zheng et al., "Narrowband Ultraviolet Photodetectors Based on Nanocomposite Thin Films with High Gain and Low Driving Voltage," ACS Appl. Mater. Interfaces 2018, 10, 41552-41561.
A. K. Rath et al., "Solution Processed Inorganic Bulk Nano Heterojunctions and Their Application to Solar Cells," Nat. Photonics 2012, 6, 529-534.
Z. Yang et al., "Mixed Quantum Dot Solar Cells," Nat. Commun. 2017, 8, 1325.
B. He et al., "The Fermi surface geometrical origin of axis dependent conduction polarity in layered materials," Nat. Mater. 18, 568-572 (2019).
Search Report and Written Opinion mailed Feb. 15, 2023 in corresponding International Application No. PCT/US2022/044476.

* cited by examiner

Possible doping types of nanocrystals

Nanoparticles

Porous Green Compact

Infilled Compact

Sintered BNS

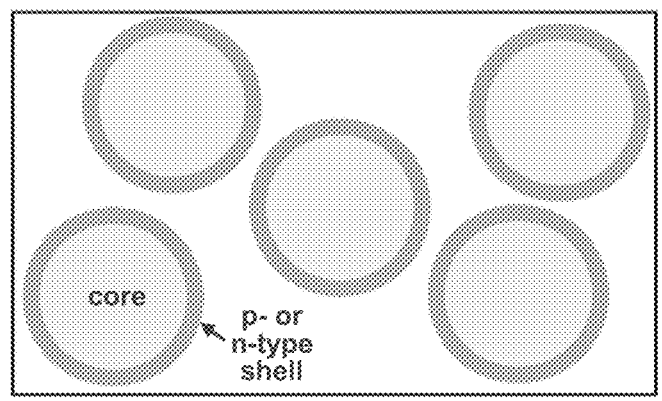
FIG. 9A — X₁/X₂ core/shell Nanoparticles
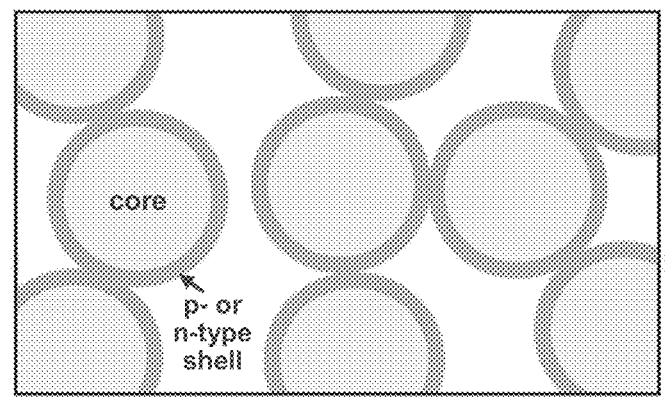
FIG. 9B — Porous Green Compact
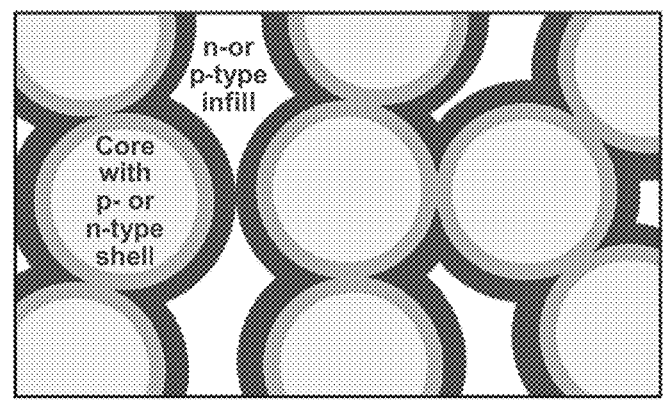
FIG. 9C — Infilled Compact
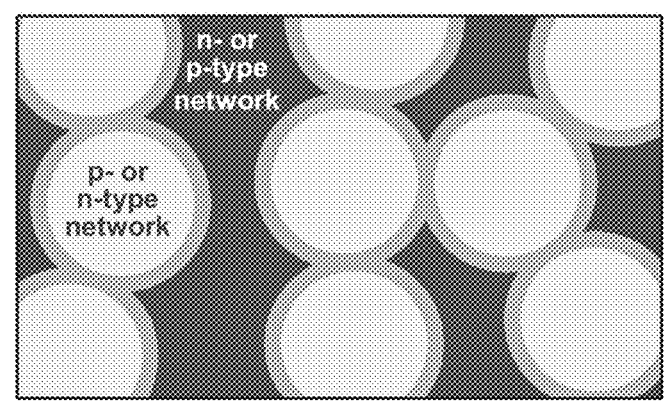
FIG. 9D — Sintered BNS Infilled Compact Sintered BNS

BIPOLAR NANOCOMPOSITE SEMICONDUCTORS

CROSS-REFERENCE

This Application is a Nonprovisional of and claims the benefit of priority under 35 U.S.C. § 119 based on U.S. Provisional Patent Application No. 63/247,819 filed on Sep. 24, 2021. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, DC 20375, USA; +1.202.767.7230; techtran@nrl.navy.mil, referencing Navy Case #210805.

TECHNICAL FIELD

The present disclosure relates to nanostructured semiconductors which simultaneously have bulk p- and n-type conductivity and methods for making the same.

BACKGROUND

In recent years, there have been promising advances in the production of electrically conductive networks of semiconductor nanoparticles having a diameter of less than 100 nm. Liquid-phase or gas-phase synthesis and deposition methods have been used to produce semiconductor nanoparticle thin films, with various thin film processing techniques (e.g., thermal or photonic annealing, ligand exchange reactions, atomic layer deposition) being used to increase interparticle conductivity. For example, laser annealing was used to remove ligands from and sinter thin films of PbSe semiconductor nanoparticles produced by colloidal synthesis. See B. E. Treml et al., "Processing—Structure—Property Relationships in Laser-Annealed PbSe Nanocrystal Thin Films," *ACS Nano* 2015, 9, 4096-4102. Using these methods, electron or hole mobilities have been increased by several orders of magnitude to >1 $cm^2V^{-1}s^{-1}$, and transitions from variable-range hopping to band-like electron transport have been achieved, unlocking applications such as transparent conductors, thermoelectric generators, and field-effect transistors. See Y. Liu et al., "Robust, Functional Nanocrystal Solids by Infilling with Atomic Layer Deposition," *Nano Lett.* 2011, 11, 5349-5355; and H. Wang et al., "Air-Stable $CuInSe_2$ Nanocrystal Transistors and Circuits via Post-Deposition Cation Exchange," *ACS Nano* 2019, 13, 2324-2333); See also D. Lanigan et al., "Contact Radius and the Insulator-Metal Transition in Films Comprised of Touching Semiconductor Nanocrystals," *ACS Nano* 2016, 10, 6744-6752; and B. L. Greenberg et al., "Metal-Insulator Transition in a Semiconductor Nanocrystal Network," *Sci. Adv.* 2019, 5, eaaw1462.

Despite this progress, a major potential advantage of highly conductive semiconductor nanoparticle networks remains underexplored. Networks of spheroidal semiconductor nanoparticles often have substantial porosity, leaving room for the formation of an additional percolating conductive network within the nanoparticle network. In such cases, the pores in these networks could be filled with a semiconductor having the opposite majority carrier type (e.g., pores in a heavily doped p-type semiconductor nanoparticle network could be filled with a heavily doped n-type material) to form a bipolar nanocomposite semiconductor (BNS) having high bipolar conductivity and extremely high heterojunction interface area between the p-type and n-type networks.

To produce a BNS having high conductivity of both electrons and holes, a fundamental physical challenge must be overcome: a tortuous 3D depletion region will form at the interface of the p-type and n-type networks and impinge on the interparticle contacts, reducing the effective electrical contact area between neighboring domains and thus the overall conductivity of the material. This challenge can be overcome by (1) maximizing the doping levels to decrease the depletion width and charge carrier Fermi wavelengths and/or (2) maximizing the cross-sectional areas of the conducting channels to compensate for the loss of effective electrical contact area due to depletion. See T. Chen et al., "Metal-Insulator Transition in Films of Doped Semiconductor Nanocrystals," *Nat. Mater.* 2016, 15, 299-303. A BNS produced by a combination of approaches (1) and (2) can have much higher bipolar conductivity than previous p/n nanocomposites produced for photocatalysis or for photosensing or photovoltaic devices.

Generally, p/n nanocomposites produced for photocatalysis are not designed for macroscopic charge transport, while those produced for photosensing consist of p(n)-type nanostructures embedded in n(p)-type matrices such that only one semiconductor percolates through the device and/or the p- and n-type networks have low carrier mobility. See M. Miyauchi et al., "Selective Growth of N-Type Nanoparticles on P-Type Semiconductors for Z- Scheme Photocatalysis," *ACS Appl. Mater. Interfaces* 2013, 5, 9770-9776; and V. Nguyen et al., "Novel P-n Heterojunction Nanocomposite: $TiO2$ $QDs/ZnBi2O4$ Photocatalyst with Considerably Enhanced Photocatalytic Activity under Visible-Light Irradiation," *J. Phys. Chem. C* 2020, 124, 27519-27528); See also F. Guo et al., "Nanocomposite Ultraviolet Photodetector Based on Interfacial Trap-Controlled Charge Injection," *Nat. Nanotechnol.* 2012, 7, 798-802; and E. Zheng et al., "Narrowband Ultraviolet Photodetectors Based on Nanocomposite Thin Films with High Gain and Low Driving Voltage," *ACS Appl. Mater. Interfaces* 2018, 10, 41552-41561.

Although both the p-type and n-type networks in a typical p/n nanocomposite used in a bulk heterojunction photovoltaic device percolate, i.e., the discrete objects (nanoparticles, etc.) in each network connect to one another such that the conducting particles form a continuous path across the entire material, they are not both heavily doped and therefore cannot give rise to high bipolar conductivity or band-like charge transport. See A. K. Rath et al., "Solution-Processed Inorganic Bulk Nano-Heterojunctions and Their Application to Solar Cells," *Nat. Photonics* 2012, 6, 529-534; and Z. Yang et al., "Mixed-Quantum-Dot Solar Cells," *Nat. Commun.* 2017, 8, 1325. A new type of a bipolar layered material showing anisotropic conduction was reported in B. He et al., "The Fermi surface geometrical origin of axis-dependent conduction polarity in layered materials," *Nat. Mater.* 18, 568-572 (2019), but this material did not include interpenetrating or/and percolation nanocrystal networks.

Better charge transport in such semiconductor nanocomposite structures is therefore desirable.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a bipolar nanocomposite semiconductor (BNS) in which electrons and holes are separately transported throughout the BNS volume via an interpenetrating plurality of networks that form charge transport channels, where some of the networks have one conductivity type (for example, n-type) and others have the opposite conductivity type (p-type).

The interpenetrating networks can include one or more multiple nanocrystalline structures, metal or dielectric networks, or organic networks, and ligand networks.

In many embodiments, the BNS material is in the form of a multicomponent nanocrystalline material in which at least one component consists of nanocrystallites or has at least one nanoscale dimension.

In many embodiments, the BNS material in accordance with the present invention comprises semiconducting and/or dielectric and/or metal nanoparticles that might be covered by metal or/and dielectric and/or metal shells, where some of the nanoparticles form at least two percolating conducting paths at direct current and/or alternate current conduction.

The invention also provides methods for making a bipolar nanocomposite semiconductor solid consisting of interpenetrating n-type and p-type networks of nanodomains that are intimately connected to enable band-like transport of both electrons and holes throughout the material.

BRIEF DESCRIPTION OF THE DRAWINGS

FIGS. 9A-9D are block schematics illustrating aspects of forming, infilling and sintering of a porous compact of core/shell nanoparticles to form a BNS material in accordance with one or more embodiments of the present invention.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

As described in more detail below, the present invention provides a bipolar nanocomposite semiconductor (BNS) material in which electrons and holes are separately transported throughout the BNS volume via an interpenetrating plurality of networks, where some of the networks have one conductivity type (for example, n-type) and others have the opposite conductivity type (p-type). The interpenetrating networks can include one or more multiple nanocrystal structures, metal networks, or organic networks, and ligand networks.

In many embodiments, the BNS material is in the form of a multicomponent nanocrystalline material in which at least one component consists of nanocrystallites or has at least one nanoscale dimension.

In many embodiments, the BNS material in accordance with the present invention comprises semiconducting and/or dielectric and/or metal nanoparticles that might be covered by metal or/and dielectric and/or metal shells, where some of the nanoparticles form at least two percolating conducting paths at direct current and/or alternate current conduction.

The invention also provides methods for making a bipolar nanocomposite semiconductor solid consisting of interpenetrating n-type and p-type networks of nanodomains that are intimately connected to enable band-like transport of both electrons and holes throughout the material.

Figure 1:
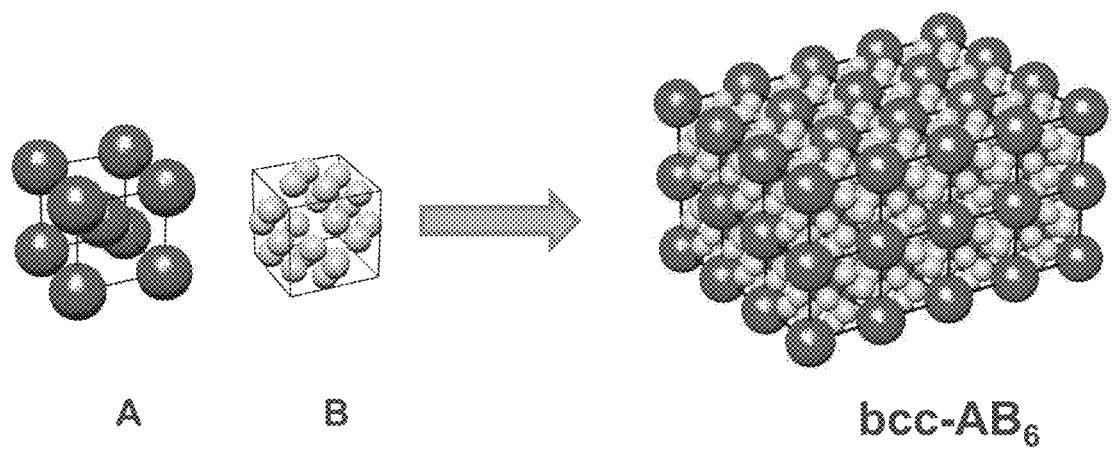
FIG. 1 is a block schematic illustrating an exemplary bipolar nanocomposite semiconductor (BNS) in which electrons and holes are separately transported in accordance with the present invention.

The block schematic in FIG. 1 illustrates the general concepts utilized in the present invention. As illustrated in FIG. 1, a bipolar nanocomposite semiconductor (BNS) is formed, for instance, by the interconnected network of semiconductor nanoparticles/nanocrystals A bonded to each other and interconnected network of semiconductor nanoparticles/nanocrystals B in between, also bonded to each other and to nanoparticles/nanocrystals A resulting in a crystalline nanocomposite. Electrical charges are separately transported through the network A and B of the material. For example, sublattice A is composed of an n-type semiconductor so that electrons are transported via a transport channel in sublattice A, and sublattice B is composed of a p-type semiconductor so that holes are transported via a transport channel in sublattice B. As described in more detail below, in many cases, one or more of sublattices A and B can be formed from percolated nanocrystals of one or more elements, or from core/shell nanocrystals that are engineered to produce predetermined charge transport channels that allow the conducting particles to percolate, i.e., to form continuous three-dimensional conducting paths, so that the charges are is transported throughout the material in a predefined manner.

The key parameter of the percolation process is the percolation threshold. If the concentration of the nanocrystals of type A varies from low to high, these nanocrystals will not form a conducting path at low concentrations, but will form a conducting path at high concentrations. The concentration at which the conducting path first appears is called the percolation threshold.

A unique feature of the BNS system of the present invention is that it can provide controlled percolation of charge in both n-type and p-type networks separately, where transport channels for electrons and/or holes can be formed once the concentration of each n- or p-type constituents exceeds the percolation threshold, and where one or more of the electrons and/or holes in the n-type and/or p-type networks can percolate throughout the material via their respective transport channels. This provides a significant improvement over existing material systems enabling controlled crossing of the percolation threshold of n-type or p-type nanoconstituents.

In some cases, the percolation threshold of one type of network can depend on the percolation threshold of the other type of network. In some cases, the percolation threshold of one type of network can depend on the relative concentrations of the particles of each the n-type and p-type networks.

Figure 2A:
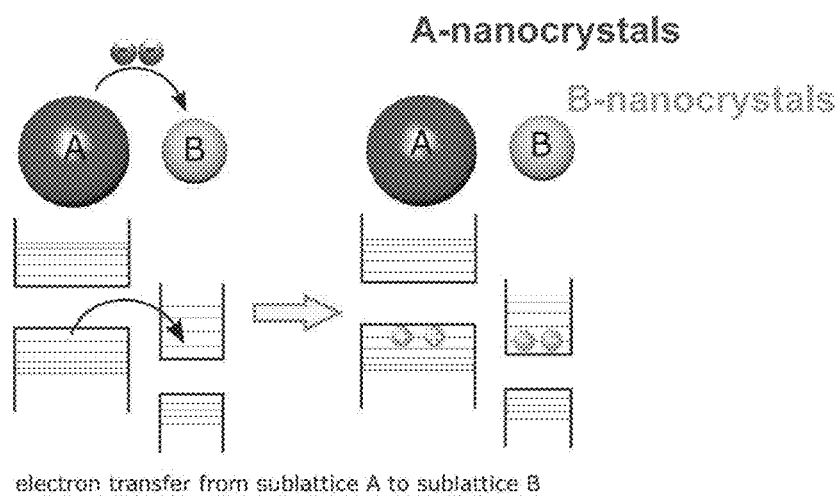
FIGS. 2A and 2B are block schematics illustrating band diagrams and aspects of carrier transport in an exemplary BNS material in accordance with the present invention.
Figure 2B:
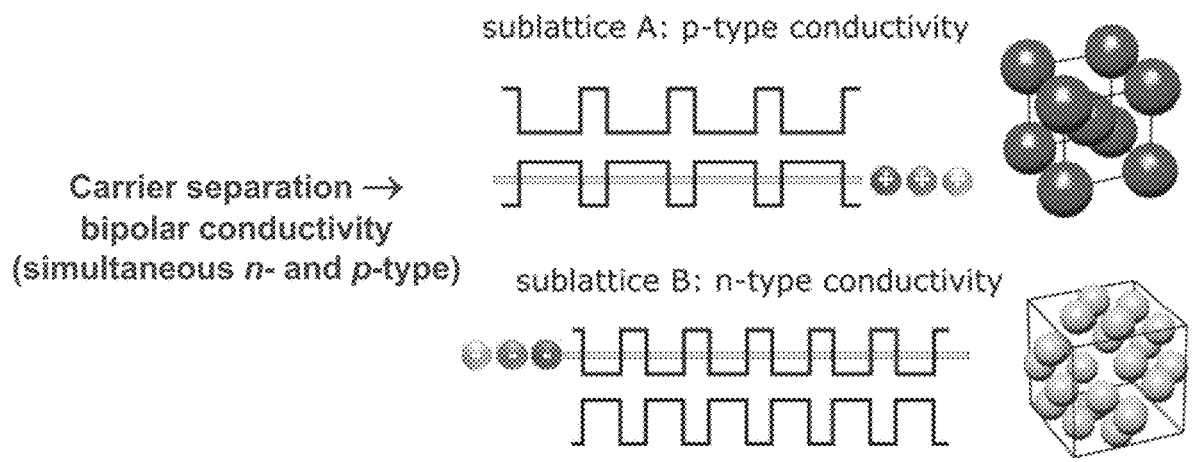

The BNS structure in accordance with the present invention permits the realization of different mechanisms of electron and hole transport between the n-type and p-type nanocrystals. FIGS. 2A and 2B illustrate aspects of exemplary band structures of a BNS comprising materials that form a Type III heterojunction, i.e., a heterojunction in which the first (A) of two semiconductors forming bonded networks/sublattices has a valence band edge energy higher than conduction band edge energy of the second semiconductor (B). It creates a driving force for electrons to migrate through the heterojunction from the valence band of semiconductor A to the conduction band of semiconductor B. As a result, a majority carriers in semiconductor A are holes, and a majority carriers in semiconductor B are electrons, and the material has bipolar conductivity. By combining both networks/sublattices into an interpenetrating network in a single material structure as in the material shown in FIG. 1, a material that exhibits both n- and p-type conductivity via separate transport channels can be formed.

Figure 3A:
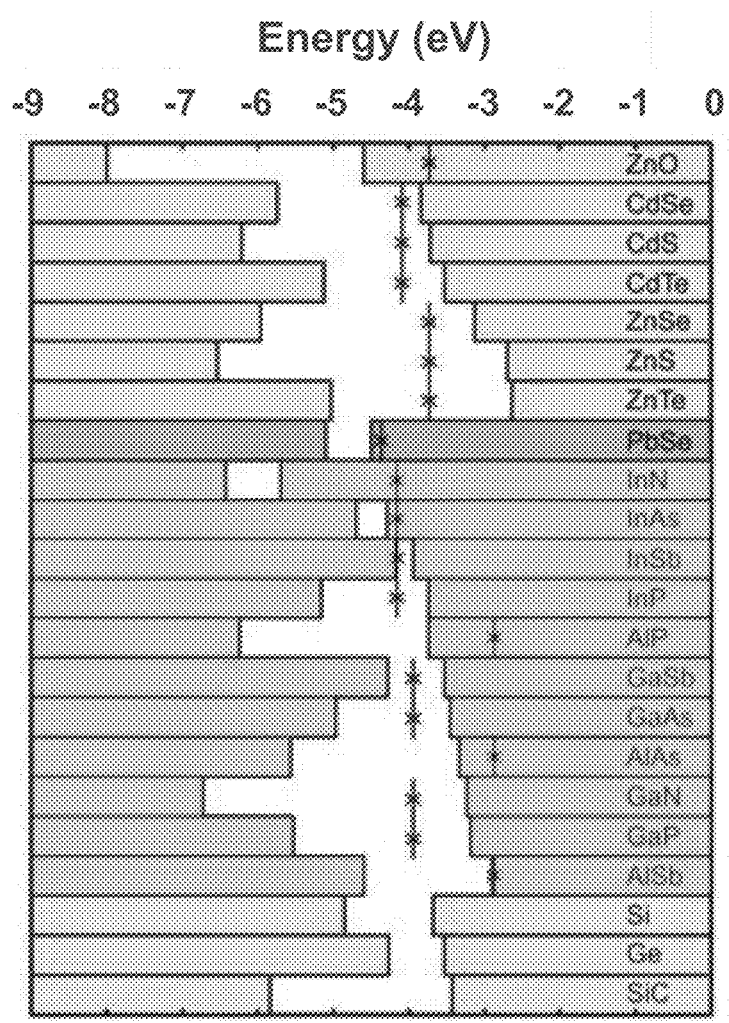
FIGS. 3A and 3B are block schematics showing the band alignment for some candidate materials and compounds that can be used for a BNS material in accordance with one or more embodiments of the present invention.
Figure 3B:
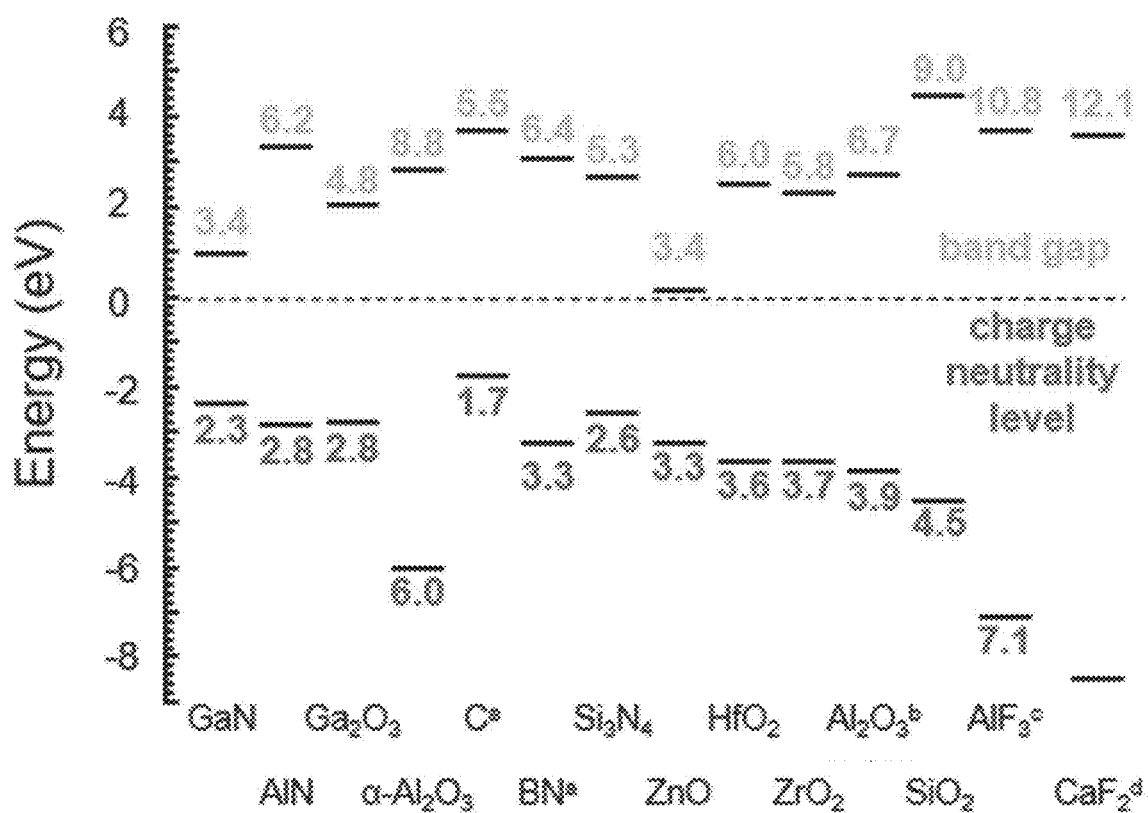

FIGS. 3A and 3B provide the band alignment of some exemplary materials that can be used to form one or more of the interpenetrating networks of sublattice A and sublattice B as described above. Particularly useful combinations of materials of such pairs include ZnO/InSb, ZnO/GaSb, ZnO/Ge, ZnO/Si systems; PbSe/InSb, PbSe/GaSb, PbS/InSb, PbS/GaSb systems; InAs/Ge, InAs/InN systems; InN/CdTe, InN/ZnTe, InN/PbSe systems; and GaN, AlN, AlGaN, AlInN, InN systems. One skilled in the art will readily recognize that other materials and combinations of materials can also be used, and BNS materials formed from all such materials and combinations of materials are deemed to be within the scope of the present invention.

In more general case, the BNS materials in accordance with the present invention can be made using a semiconductor A, which has p- or n-type conductivity before it forms a junction with semiconductor B, which has an opposite p- or n-type conductivity. Semiconductor A can be doped with an acceptor or donor and semiconductor B can be doped with an opposite type of dopant, i.e., donor or acceptor.

As noted above, the BNS material in accordance with the present invention comprises semiconducting and/or dielectric and/or metal nanoparticles that might be covered by metal or/and dielectric and/or metal shells, where some of the nanoparticles form at least two percolating conducting paths at direct current and/or alternate current conduction.

In more general case, the BNS materials in accordance with the present invention are materials comprising semiconductor and/or dielectric and/or metal three-dimensional networks with nanoscale dimensions which form at least two percolating conducting paths of electrons and holes at direct current and/or alternate current conduction.

In addition, as described in more detail below, it should be noted that for all different interaction mechanisms, depletion regions form at the interface between the n-type and p-type nanocrystals. In contrast to conventional planar p-n junctions, the BNS structure in accordance with the present invention supports a three-dimensional network of the depletion regions yielding a much larger depletion region area. This results in a dramatic enhancement of the charge collection under illumination with possible applications for efficient solar cells and photodetectors. Another key advantage is a very large sensitivity to perturbating signals near the percolation points.

Another advantage of the BNS structure in accordance with the present invention is that by choosing the materials A and B, conduction band discontinuities ranging in value from as large as a few electron volts to the negative values (corresponding to the conduction states overlap) can be engineered. This allows for flexibility of the BNS design to allow for switching the current path between the n- and p-type networks.

Figure 4A:
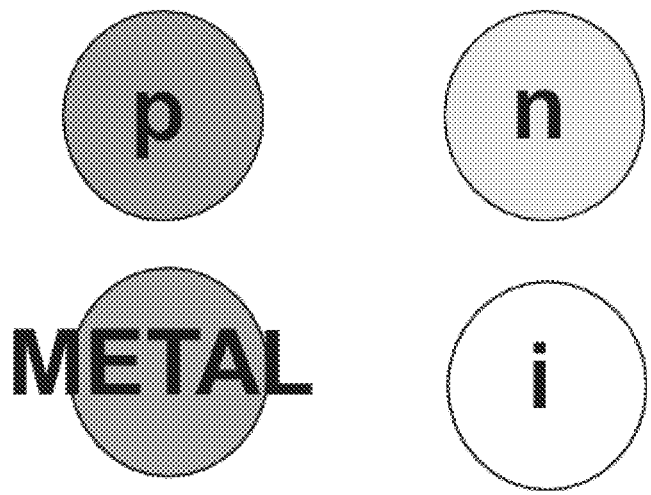
FIGS. 4A and 4B are block schematics illustrating possible types of dopant nanocrystals that can be used in a BNS material in accordance with one or more embodiments of the present invention.
Figure 4B:
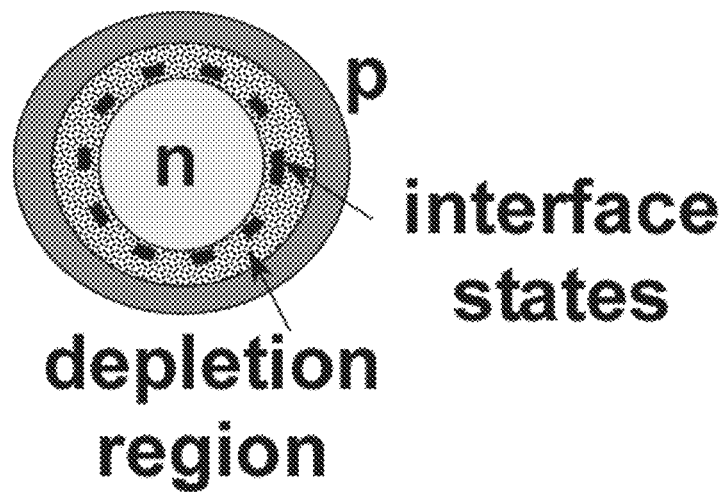

The block schematics in FIGS. 4A and 4B illustrate that BNS structures could also be made by incorporating metal and dielectric nanoparticles as shown in FIG. 4A. Alternatively, an insulating material such as silicon oxide could serve as a matrix material incorporating n-, p- or metal percolating or non-percolating nanoparticles. Still another embodiment of a nanoparticle is an n-type nanoparticle with a p-type shell as shown in FIG. 4B. Alternatively, a composite nanoparticle could comprise a p-type core and an n-type shell, where the shell and the core are different materials, e.g., ZnO and Si, or the same material, e.g., Si, but with different doping (n and p) for the shell and the core.

In either case, there is a depletion region between the core and the shell as shown in FIG. 4B. The width of depletion regions between the shell and the core of the nanocrystal shown in FIG. 4B depends on the electric field applied to the core/shell material. This parameter determines the capacitance of the composite nanocrystal and, therefore, its dependence on the applied field enables sensing applications.

The BNS materials of the present invention can be made by the processes described below. In accordance with the present invention, these processes include several required steps, with each step of the process being a preferred part, as well as all steps together to make the process sufficient. To provide clean interfaces between all constituents of the synthesized BNS, all processing steps are preferred to be conducted in a controlled atmosphere with air-free transfer between steps.

It should be noted, however, that the described processes are merely exemplary, and that other suitable processes for making a BNS material in accordance with the present invention can be used, and all suitable processes and BNS materials made from such processes are deemed to be within the scope of the present invention.

Figure 5:
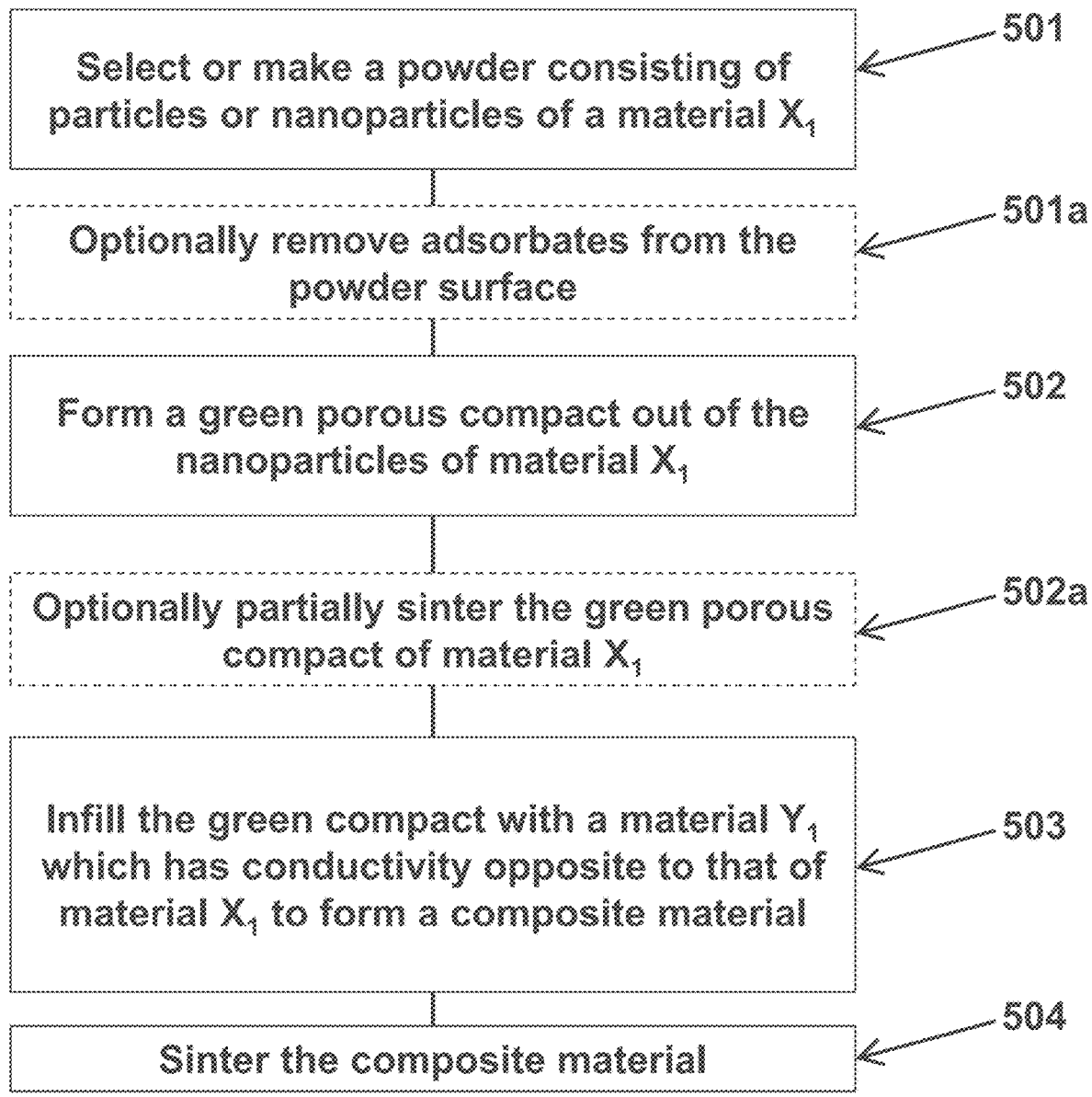
FIG. 5 is a block schematic illustrating aspects of an exemplary process flow for forming a BNS material in accordance with one or more embodiments of the present invention.

The flow diagram in FIG. 5 and the block schematics in FIGS. 7A-7D illustrate aspects of the process steps used in various exemplary embodiments of processes for making BNS materials in accordance with the present invention. The basic process steps in each of the embodiments described below are the same, and so will not be repeated in the description of each embodiment for the sake of brevity, with only the process steps that are different from those in other embodiments being described in detail. For example, in the description of the second embodiment of a method for making a BNS material in accordance with the present invention, Steps I, II, and IV proceed as described with respect to the first embodiment, with only Step III being described in detail.

Figure 7A:
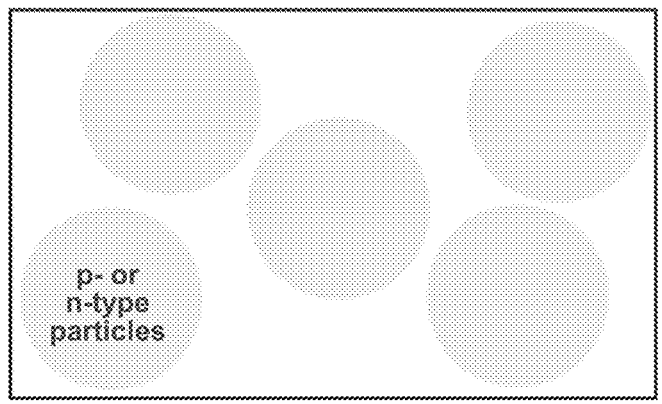
FIGS. 7A-7D are block schematics illustrating aspects of forming, infilling and sintering of a porous compact to form a BNS material in accordance with one or more embodiments of the present invention.

Thus, as shown as Step 501 in FIG. 5 and as schematically illustrated in FIG. 7A, Step I of this process includes selecting or making a powder consisting of particles or nanoparticles of a material $X_1$, where material $X_1$ is a first material having a p- or n-type conductivity type $\sigma_{X1}$. The powder of the semiconductor material can be made by any suitable technique such as ball milling, laser ablation, precipitation from solution, and hydrothermal and ammonothermal synthesis. In many embodiments, the powder will be a nanopowder comprising nanoparticles having a particle size of about 3 nm to about 500 nm.

Adsorbates such as water or oxides from the powder surface can also be removed in this Step I before proceeding to the next steps, as shown by Step 501a in FIG. 5. The surface cleaning can be accomplished by any suitable technique, though it is preferred that the cleaning is conducted in a furnace at elevated temperatures in a controlled atmosphere. Oxide removal can be conducted at elevated temperatures by reduction in an atmosphere with hydrogen.

Figure 6A:
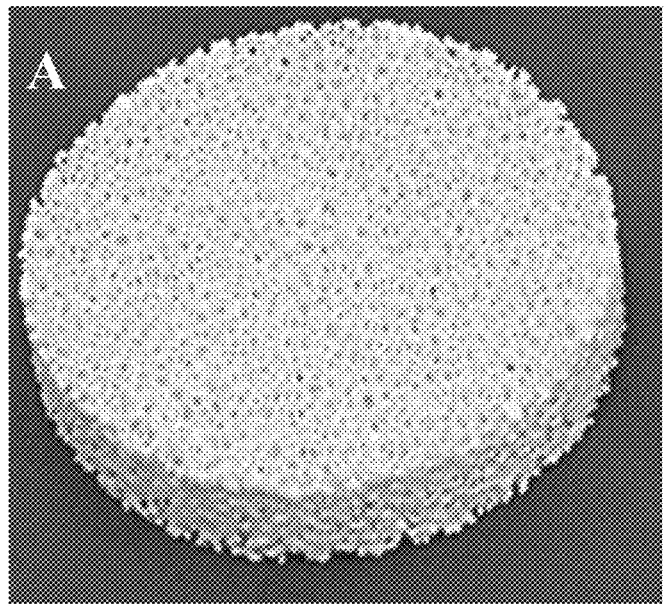
FIGS. 6A and 6B are images showing aspects of exemplary porous compacts formed in accordance with the prior art.
Figure 6B:
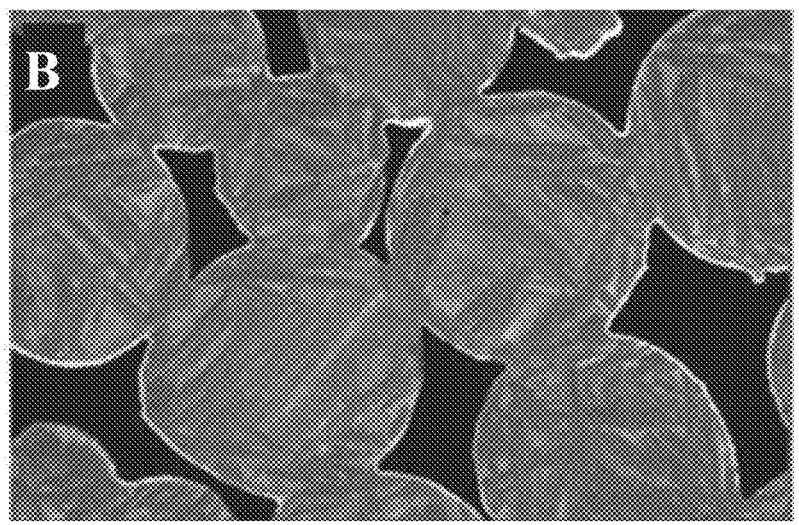
Figure 7B:
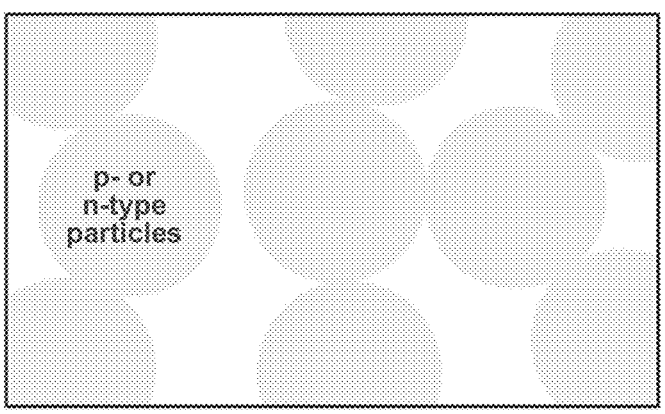

In Step II of the process for making a bipolar nanocomposite semiconductor material in accordance with the present invention, shown as Step 502 in FIG. 5 and in FIG. 7B, the powder of material $X_1$ is formed into a porous compact such as the porous compact shown in FIGS. 6A and 6B, creating a particle or nanoparticle interconnected network having an open porosity that permits a gas or a liquid to permeate the compact.

The porous compact can be made by the technique described below but can also be made by means of any existing technique such as techniques involving assembling or growing blocks of a porous compact or techniques making pores in existing material.

Thus, in some cases, the compact can be made by pressing the powder of material $X_1$ in the container or die, and this compact is usually called a green compact. In other embodiments, the porous compact can be made by sintering the loose nanoparticle powder such that particles neck without densification and form strong chemical or metallic bonds with each other, as illustrated in FIG. 6B. In an optional step 502a shown in FIG. 5, the green porous compact of material $X_1$ can be partially sintered while preserving an open porosity and making strong chemical or metallic bonds between particles.

Figure 7C:
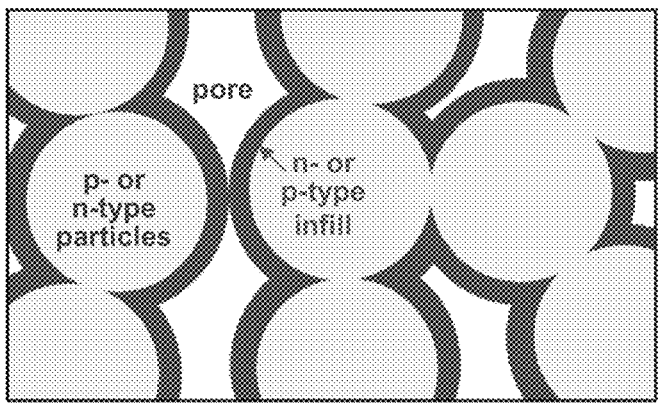
Figure 7D:
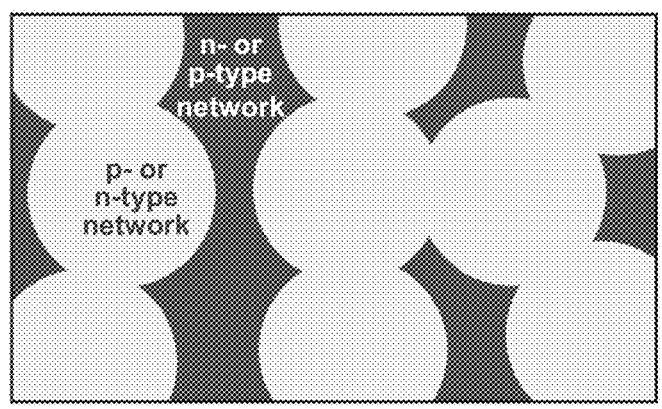
Figure 8A:
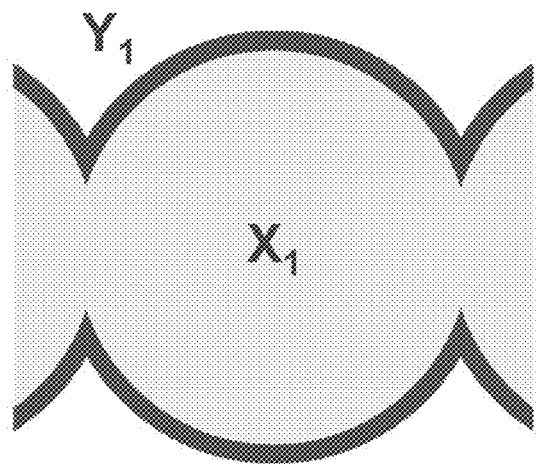
FIGS. 8A-8C are block schematics are block schematics illustrating three-particle fragments of exemplary porous compacts after infilling but before sintering according to various embodiments of the methods for making a BNS material in accordance with one or more embodiments of the present invention.

In Step III of the process for making a bipolar nanocomposite semiconductor material in accordance with the present invention, shown as Step 503 in FIG. 5 and schematically in FIG. 7C, the porous compact of $X_1$ material, which initially has a form similar to that shown by the schematic in FIG. 7B, is infilled with a material $Y_1$, where $Y_1$ can be the same semiconductor material as $X_1$ or can be a different semiconductor material, so long as the conductivity $\sigma_{Y1}$ of material $Y_1$ is different from the conductivity $\sigma_{X1}$ of material $X_1$. During infilling, material $Y_1$ conformally coats all available surfaces in the pores inside the $X_1$ compact, as illustrated by the schematics in FIGS. 7C and 8A, to form a composite material consisting of both $X_1$ and $Y_1$ materials, creating n- and/or p-type networks which both percolate, i.e., provide three-dimensional conducting paths for electrons and holes throughout the entire material system.

This Step III of the process for making a BNS material in accordance with the present invention requires precise control of nanoscale thickness or the amount and uniform distribution of the deposited material $Y_1$ on the surfaces of $X_1$. Infilling a porous compact and conformally coating all available surfaces of $X_1$ with a material $Y_1$ can be performed by any available technique for thin film deposition including but not limited to chemical vapor deposition (CVD), electrochemical deposition, chemical deposition from solution, infiltration by melt, etc. Atomic layer deposition (ALD) is the preferred technique for infilling and deposition material $Y_1$ on the surfaces of $X_1$.

Finally, in Step IV (shown as Step 504 in FIG. 5 and schematically in FIG. 7D), the composite material formed in Step III is sintered in order to remove residual porosity and form a solid with intimately connected p-type and n-type networks having strong chemical bonds at all interfaces. The sintering process should be conducted in a manner that preserves the intended structure of the composite with percolating p- and n-type semiconductors and results in a BNS solid such as that illustrated by the block schematic in FIG. 7D. In some cases, the sintering process can result in a BNS material having at least some residual porosity.

Figure 8B:
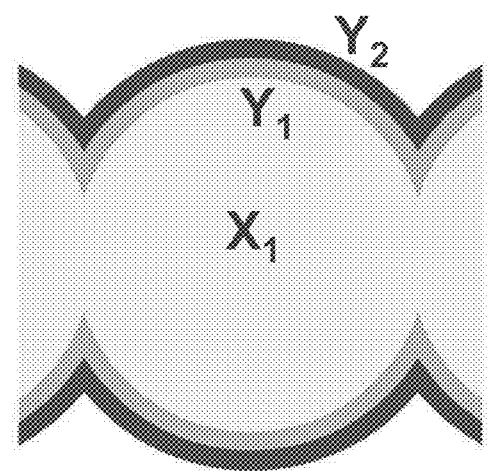

In a second embodiment of a process for making a BNS in accordance with the present invention, Steps I, II, and IV proceed as described above with respect to the first embodiment. In Step III of this second embodiment, the process of infilling and conformally coating all available surfaces inside the porous compact of material $X_1$ with a material $Y_1$ is interrupted while the compact retains an open porosity, and the step of infilling is repeated with a second material $Y_2$ which has a conductivity $\sigma_{Y2}$ opposite to the conductivity $\sigma_{X1}$ of material $X_1$, in a manner such as is illustrated by the schematic in FIG. 8B.

In a third embodiment of the process for making a BNS in accordance with the present invention, Steps I and II also proceed as described above with respect to the first embodiment, but in this third embodiment, Step III of infilling and conformally coating all available surfaces inside the porous compact of material $X_1$ with a material $Y_1$ is interrupted while the compact retains an open porosity, with the steps of infilling being repeated with materials $Y_2, Y_3, \ldots, Y_{N-1}$ while the compact retains an open porosity for the final infilling step with material $Y_N$, which has an opposite type of conductivity than material $X_1$. Additional materials $Y_1$, $Y_2, Y_3, \ldots Y_N$ can be any materials including semiconductors, metals and insulators, with the choice of material(s) being determined by the desired properties and application of the final BNS.

In a fourth exemplary embodiment of the process for making a BNS in accordance with the present invention, aspects of which are schematically illustrated in FIGS. 9A-9D, instead of a nanopowder whose particles each consist of a single material, the nanopowder can consist of core/shell nanoparticles where material $X_1$ is the core and material $X_2$ is the shell, where $X_1$ can be any material and $X_2$ is a second material having a p- or n-type conductivity $\sigma_{X2}$.

Thus, as illustrated in FIG. 9A, in Step I of this fourth embodiment, a nanopowder consisting of these core/shell nanoparticles is made or selected.

During Step II of this fourth embodiment, as illustrated in FIG. 9B, the $X_1/X_2$ core/shell nanopowder is formed into a porous compact creating a core/shell particle or nanoparticle network with an open porosity in a manner as described above with respect to the first embodiment.

Figure 8C:
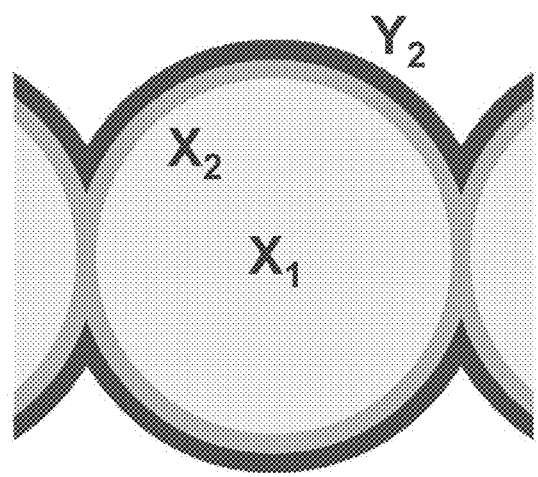

As illustrated in FIG. 9C, in Step III of this fourth embodiment, the porous compact formed from the $X_1/X_2$ nanopowder is infilled with a material $Y_1$, where $Y_1$ is a semiconductor which has a p- or n-type conductivity $\sigma_{Y1}$ which is opposite to the conductivity of shell material $X_2$. During this infilling step, the $Y_1$ material is made to conformally coat all of the available surfaces inside the $X_1/X_2$ porous compact, using any suitable technique such as atomic layer deposition (ALD) to produce a composite material consisting of percolated X2 network and percolated Y1 network before sintering. The fragment of these two networks is shown in FIG. 8C, which shows the $X_1/X_2$ cores coated with material $Y_1$.

As illustrated in FIG. 9D, this composite material can then be sintered as in Step IV of the process described above to form a bipolar nanocomposite semiconductor (BNS) material with strong chemical or metallic bonds between all constituents. The result is a composite material consisting of semiconductors $X_2$ and $Y_1$ having opposite conductivities $\sigma_{X2}$ and $\sigma_{Y2}$, both of which percolate across the entire solid in a manner illustrated by the block schematic in FIG. 9D.

In a fifth embodiment of a process for making a BNS material in accordance with the present invention, the process of infilling and conformally coating all available surfaces inside the porous compact of material $X_1/X_2$ with a material $Y_1$ (semiconductor, metal, dielectric, etc.) is interrupted while the compact retains an open porosity and the step of infilling is repeated with a material $Y_2$, which has a conductivity $\sigma_{Y1}$ opposite to the conductivity $\sigma_{X2}$ of material $X_2$. In an exemplary embodiment, material $Y_1$ can be ZnO and material $Y_2$ can be GaN. In other embodiments, $Y_1$ and $Y_2$ can be the same material, e.g., Si, but with different doping types (n and p), so long as $Y_1$ has a conductivity type opposite the conductivity type of the outermost material in the core.

In a sixth embodiment of a process for making a BNS in accordance with the present invention, the process of infilling and conformally coating all available surfaces inside the porous compact of the material $X_1/X_2$ is repeated with materials $Y_1, Y_2, \ldots, Y_{N-1}$ while the compact retains an open porosity for the final infilling step with material $Y_N$, which has conductivity type $\sigma_{YN}$ opposite to the conductivity $\sigma_{X2}$ of the material $X_2$. Materials $Y_1, Y_2, Y_3, \ldots Y_N$ can be any materials including semiconductors, metals and dielectrics, with the choice of material(s) being determined by the desired properties and application of the final BNS.

In a seventh embodiment of a process for making a BNS in accordance with the present invention, the starting powder consists of core/shell nanoparticles having a structure $X_1/X_2/\ldots/X_N$ where material $X_1$ is the core, $X_2 \ldots X_{N-1}$ are intermediate layers, and $X_N$ is the outer shell, where $X_N$ is a semiconductor which has p- or n-type conductivity $\sigma_{XN}$ and $X_1, X_2, \ldots X_{N-1}$ can be any materials including semiconductors, metals and dielectrics/insulators. The materials choices depend on the desired properties and application of the final BNS.

Thus, Step I in this seventh embodiment includes the step of making or selecting nanopowder consisting of $X_1/X_2/\ldots/X_N$ core/shell nanoparticles where material $X_N$ is an outer shell being a semiconductor which has p- or n-type conductivity $\sigma_{XN}$.

In Step II of this seventh embodiment, the $X_1/X_2/\ldots/X_N$ core/shell nanopowder of the material is formed into a porous compact, creating a core/shell particle or nanoparticle network having an open porosity as described above with respect to the first embodiment.

In Step III of this seventh embodiment, the porous compact of the $X_1/X_2/\ldots/X_N$ material is infilled with a material $Y_1$, where $Y_1$ is a semiconductor which has a p- or n-type conductivity $\sigma_{Y1}$ which is opposite to the conductivity $\sigma_{XN}$ of material $X_N$. During this infilling step, the $Y_1$ material is made to conformally coat all available surfaces inside the $X_1/X_2/\ldots/X_N$ compact using any suitable technique such as atomic layer deposition (ALD), with the result being a composite material consisting of percolated $X_N$ network and percolated $Y_1$ network. This composite material can then be sintered as in Step IV of the process described above to form the final bipolar nanocomposite semiconductor (BNS) material.

In an eighth embodiment of a process for making a BNS in accordance with the present invention, the process of infilling and conformally coating all available surfaces inside the porous compact of material $X_1/X_2/\ldots/X_N$ with a material $Y_1$ is interrupted while the compact retains an open porosity and the step of infilling is repeated with a material $Y_2$, where $Y_2$ is a semiconductor which has a p- or n-type conductivity which is opposite to the conductivity of material $X_N$.

In a ninth embodiment of a process for making a BNS in accordance with the present invention, the process of infilling and conformally coating all available surfaces inside the porous compact of the material $X_1/X_2/\ldots/X_N$ in Step III are repeated with materials $Y_1, Y_2, Y_{N-1}$ to have a multiple coatings on the surfaces while the compact retains an open porosity for the final infilling step with material $Y_N$.

In Step IV of this embodiment, the formed composite material is sintered in order to remove residual porosity, intimately connect p-type and n-type domains and form strong chemical bonds at all interfaces. The sintering process should be conducted in a manner that preserves the intended structure of the composite with percolating p- and n-type semiconductors and results in a bipolar nanocomposite semiconductor solid.

In all of these embodiments, a BNS solid can be obtained that contains interpenetrating three-dimensional p-type and n-type networks that percolate throughout the solid with a depletion layer at the interface between the two networks. Band-like transport of both electrons and holes across the entire BNS solid is ensured by sufficiently large cross-sectional areas of the conductive p-type and n-type channels and sufficiently small encroachment of the depletion layer upon these channels; the former is achieved through the sintering process and the latter is achieved through the heavy doping of the p-type and n-type networks.

Figure 10A:
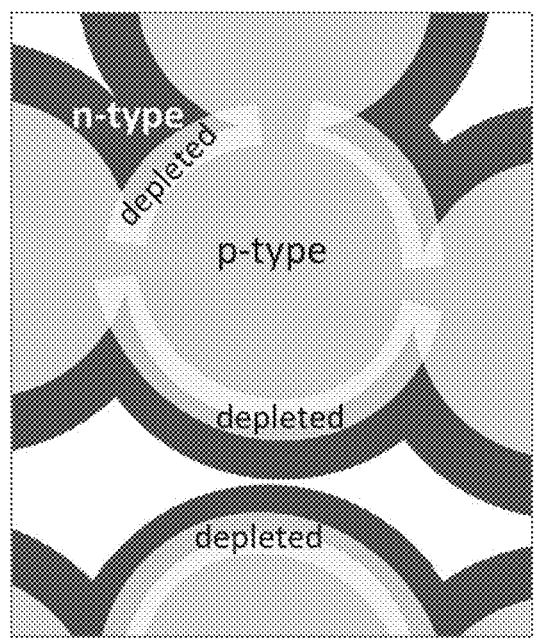
FIGS. 10A and 10B are block schematics illustrating aspects of the depletion regions formed at the interface of the p-type and n-type domains in a BNS material in accordance with the present invention.
Figure 10B:
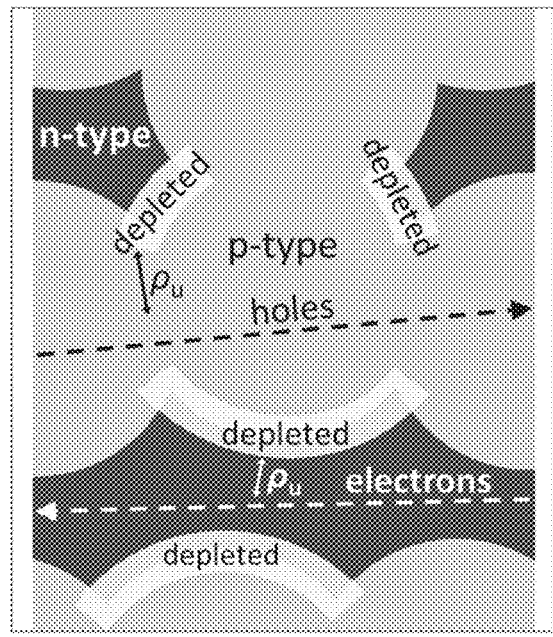

FIG. 10A shows the depletion regions at the interfaces of p-type and n-type domains in an infilled compact formed by infilling, for example, a p-type porous compact with an n-type material. The depletion regions may encroach upon the p-type and n-type networks so that the minimum cross-sectional radii of the undepleted conduction channels, $\rho_u$, are small, leading to low network conductivity. FIG. 10B shows the BNS formed by sintering the infilled compact. Sintering shrinks the depletion regions and enlarges the bottlenecks of the p-type and n-type networks, thereby increasing $\rho_u$ and network conductivity. Sufficient $\rho_u$ and doping levels enable band-like transport of both electrons and holes across the entire BNS.

Figure 11A:
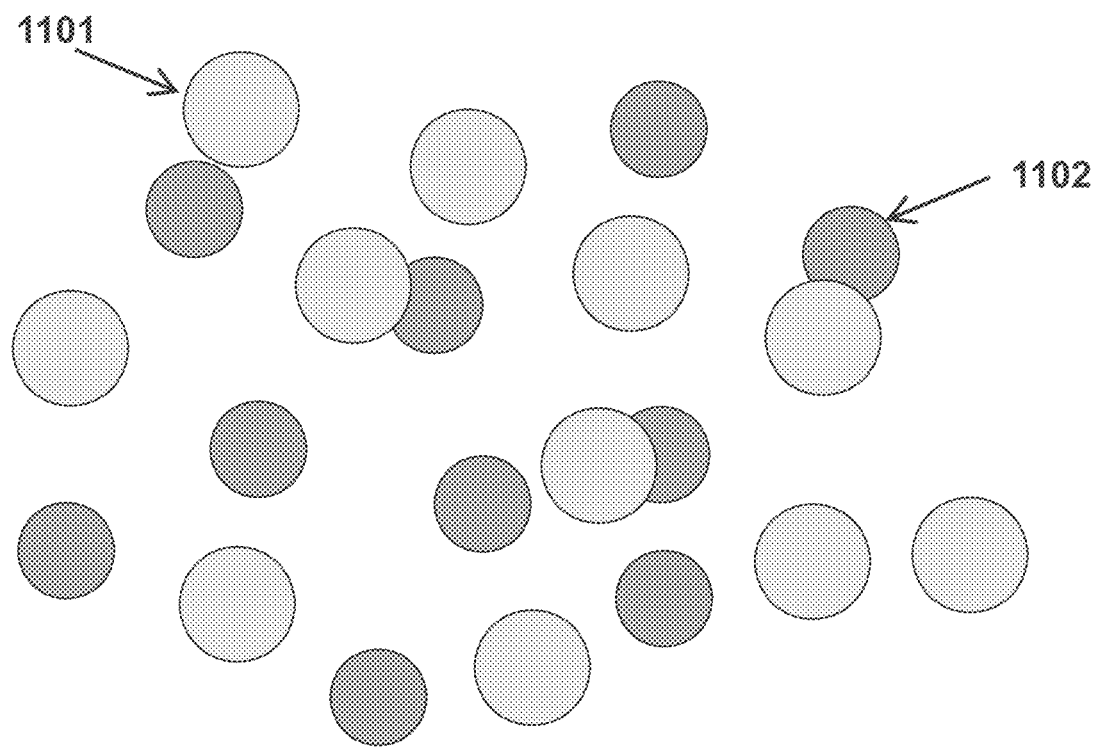
FIGS. 11A and 11B are block schematics illustrating aspects of disordered percolated binary and multicomponent BNS materials in accordance with one or more embodiments of the present invention.
Figure 11B:
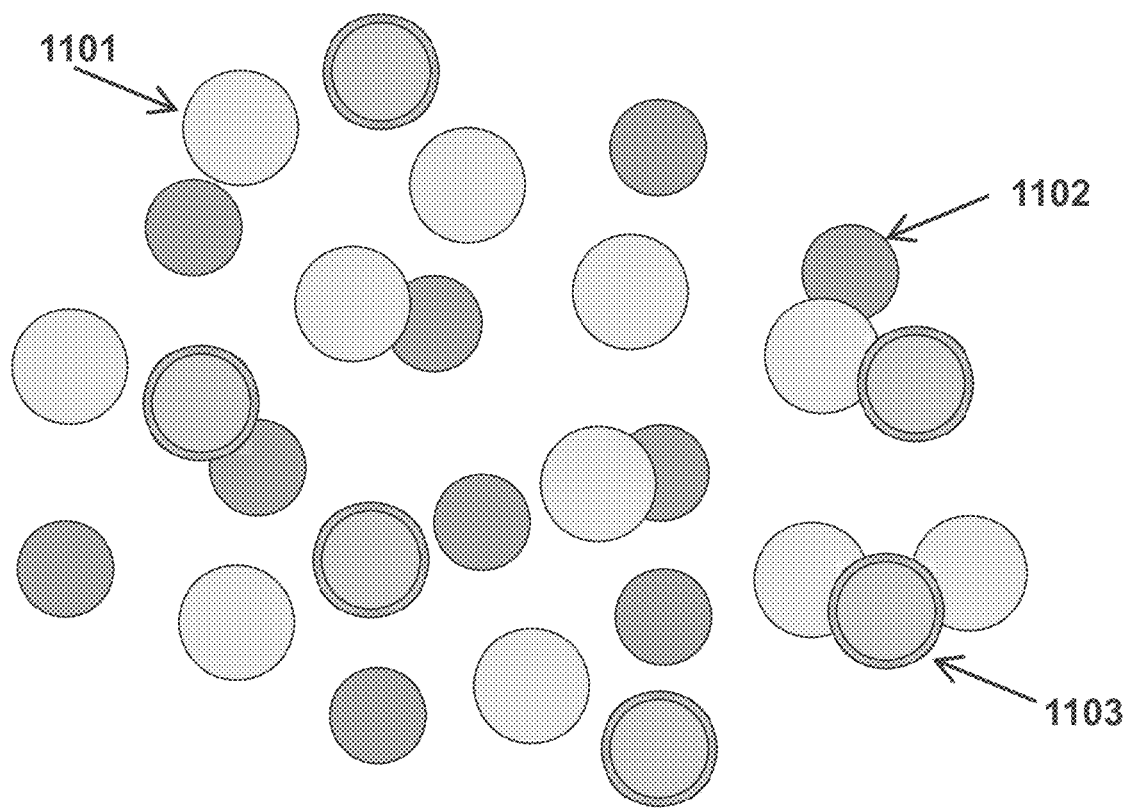

In addition to the periodic, ordered BNS material described in above, in some embodiments, BNS materials in accordance with the present invention can be in the form of a disordered BNS structure comprising one or more (for example two or three) disordered components, such as the disordered components 1101 and 1102 shown in FIG. 11A, while in some embodiments, the disordered components can also include core/shell nanocrystals 1103 shown in FIG. 11B. This disorder could be on a scale of nanoparticle sizes or it could be a long-range disorder, where close nanoparticles form an ordered structure but this order breaks down on a scale comparable to the sample dimensions.

Figure 12:
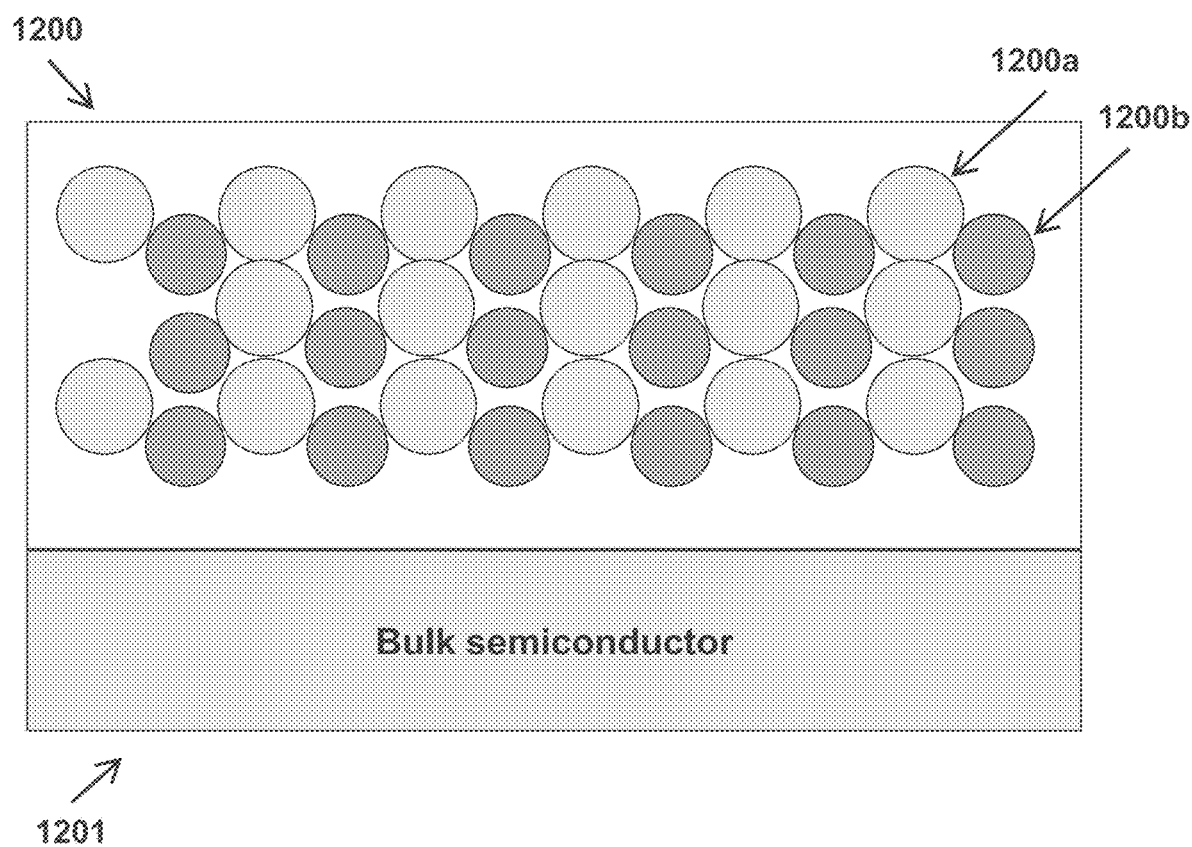
FIG. 12 is a block schematic illustrating a composite material, comprising a BNS material adjacent a bulk semiconductor material in accordance with one or more embodiments of the present invention.

In some embodiments, the BNS material in accordance with the present invention can form part of a composite material system such as that illustrated by the block schematic in FIG. 12, in which a BNS material 1200 comprising nanoparticles 1200a of a first material and nanoparticles 1200b of a second material is adjacent a bulk semiconductor material 1201.

Figure 13:
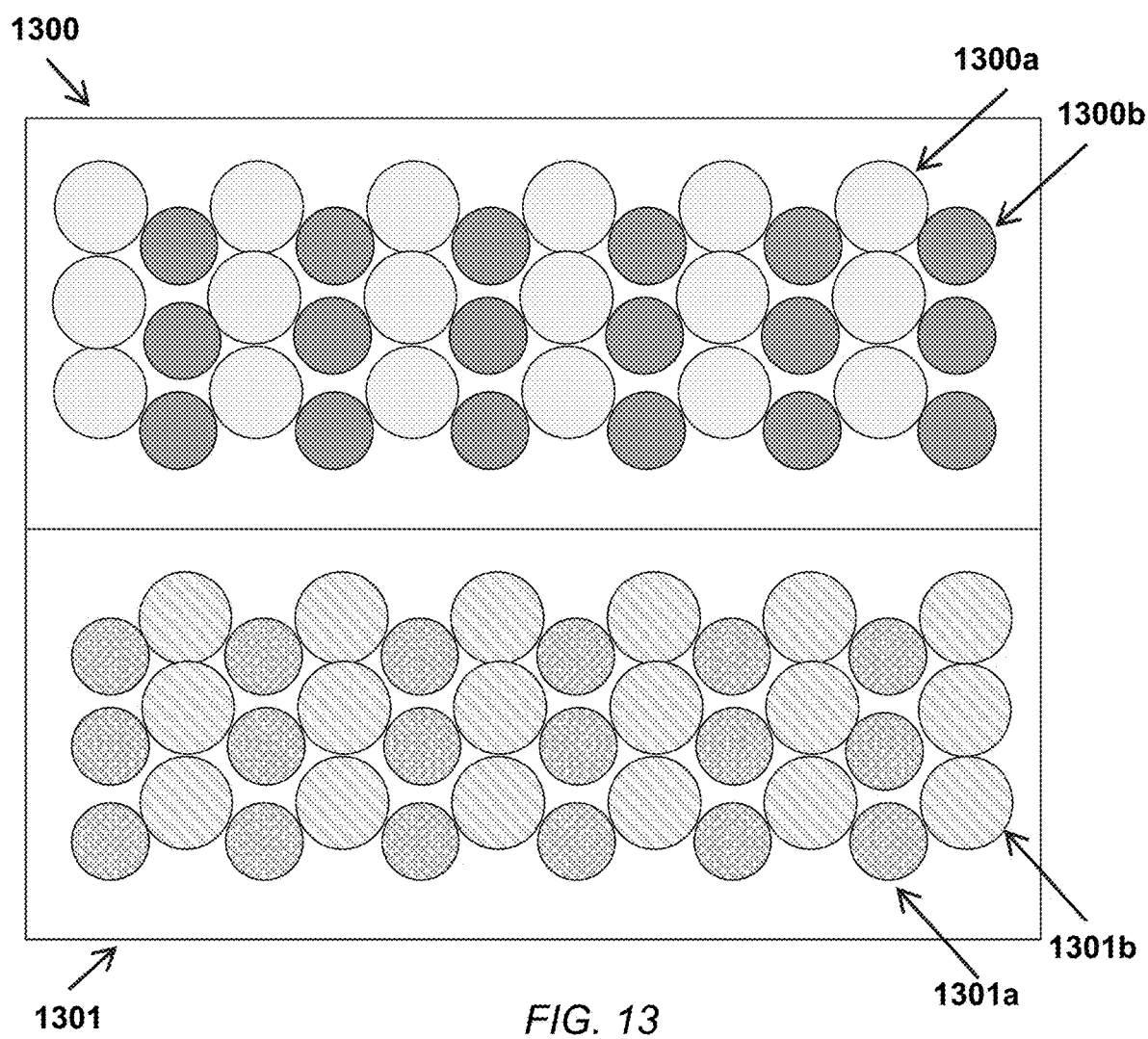
FIG. 13 is a block schematic illustrating a composite material comprising a first BNS material adjacent a second BNS material in accordance with one or more embodiments of the present invention.

In still other embodiments, more than one BNS materials can be combined into a composite material such as that illustrated in FIG. 13. In such an embodiment a first BNS material 1300 comprising nanoparticles 1300a of a first material and nanoparticles 1300b of a second material can be situated adjacent a second BNS material 1301 comprising nanoparticles 1301a of a first material and nanoparticles 1301b of a second material, where the materials used in the first and second BNS materials can be the same or different.

Figure 14:
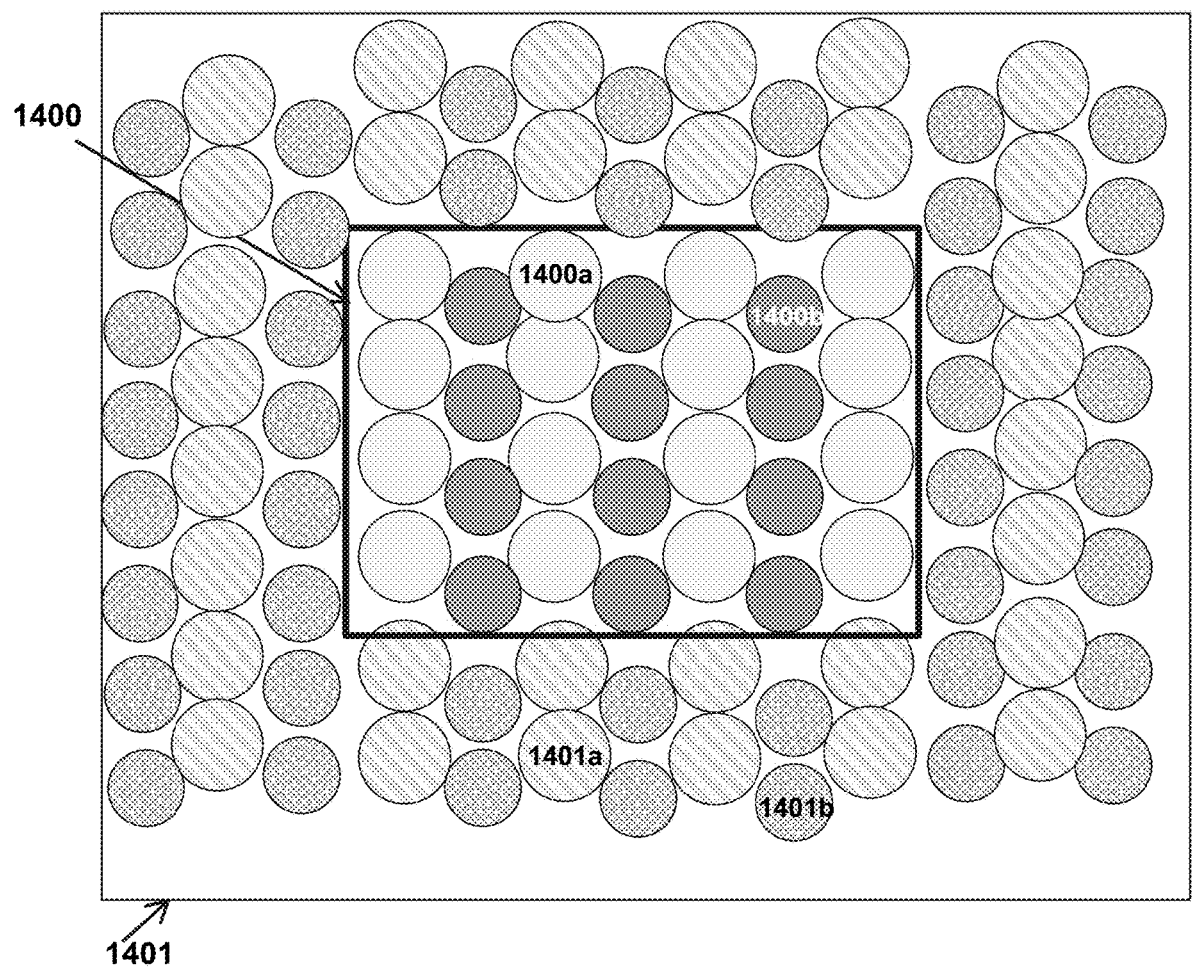
FIG. 14 is a block schematic illustrating a composite core/shell material comprising a first BNS material core within a second BNS material shell in accordance with one or more embodiments of the present invention.

In yet other embodiments, a first BNS material 1401 comprising nanoparticles 1401a and 1401b can be situated within a second BNS material 1402 comprising nanoparticles 1402a/1402b in a core/shell configuration such as that illustrated by the block schematic in FIG. 14.

These and other suitable configurations of BNS materials would be readily understood to be possible by one skilled in the art are all deemed to be within the scope and spirit of the present invention.

EXAMPLE

In this example a bipolar nanocomposite semiconductor (BNS) made from p-type germanium (Ge) nanopowder and n-type zinc oxide (ZnO) is demonstrated.

Ge powder with p-type conductivity, doped with gallium, having resistivity of about 0.0007-0.002 ohm·cm, with an average particle size of 100 nm is annealed at 450° C. for 2 hours in pure argon to remove moisture and other adsorbates from the powder surface.

After cleaning, the powder is transferred to a glove box (GB) without exposure to air. Inside the GB the powder is compacted into a cylindrical shape 10 millimeters in diameter and 1 millimeter in height.

The compact is transferred to a furnace without exposure to air and pre-sintered at 550° C. for 5 minutes in pure argon.

After the sintering, the compact has 45% porosity. Following the pre-sintering, the compact is transferred to an ALD reactor where an n-type 10-nm-thick ZnO film is deposited on all Ge surfaces inside the pores. The ZnO film is deposited via ALD at 180° C. using diethylzinc as the zinc precursor and water as the oxidant. As deposited, the ZnO film has free electron density on the order of $10^{19}$ cm$^{-3}$, presumably due to oxygen vacancies.

After the ALD step the formed composite material is sintered under a pressure of 1.0 GPa and temperature of 700 C. in order to remove residual porosity, intimately connect p-type and n-type domains, and form strong chemical bonds at all interfaces.

The resulting material represents a bipolar nanocomposite semiconductor (BNS) solid with percolating p- and n-type semiconductors.

Advantages and New Features

BNS materials present many new capabilities for applications in different electronic, photonic, and electronic devices. Contacts ranging from ohmic to rectifying could be added to a BNS material sample on one or two or more sides. These contacts might be p-type, n-type or ambipolar. They could contact one or more interpenetrating networks or might be separated from them by an insulating or tunneling layer.

Driving current via one or both sets of contacts could excite plasmons in one or more networks. One of the key BNS advantage is that the response might have a large resonant factor, and the resonant properties might be determined by the nanosizes, enabling operation in the terahertz, infrared, visible and ultraviolet ranges, while the capture area is determined by the macroscopic dimensions.

Alternatives

As noted above, in some embodiments, the invention provides a nanocomposite BNS material having one p-type network, an n-type network, and a third, undoped network separating the p- and n- networks, where at least one of the networks consists of nanocrystallites or possesses at least one nanoscale dimension.

In some embodiments, one or more of the nanopowders used to form the nanocomposite BNS material can be semiconductors, while in other embodiments, one or more of the nanopowders can be another suitable material such as a metal.

In some embodiments, a BNS material in accordance with the present invention can be made from two or more types of nanoparticles A, B, etc., where at least two of the types of nanoparticles have different n- or p-type conductivities, where the nanoparticles are sintered to form a solid in which at least two types of the conducting particles percolate, i.e., form a continuous path throughout the entire material.

In some such embodiments, one or more of nanoparticles A, B, etc., can be core/shell nanoparticles having one or more shell.

In some such embodiments, a BNS material in accordance with the present invention can be formed from three or more different types nanoparticles A, B, C, etc., where any one or more of nanoparticles A, B, C, etc., can be solid a nanoparticle or a core/shell nanoparticle having one or more shells, and where the nanoparticles are sintered to form a solid having at least two percolation paths throughout the entire material.

In other embodiments, the invention provides a nanocomposite BNS semiconductor having one p-type network and a metallic network, where at least one of the networks consists of nanocrystallites or possesses at least one nanoscale dimension.

In other embodiments, the invention provides a nanocomposite BNS semiconductor having one n-type network and a metallic network, where at least one of the networks consists of nanocrystallites or possesses at least one nanoscale dimension.

Still another embodiment is a nanocomposite BNS semiconductor with at least one network including areas of still another material.

Still another embodiment is a BNS material that is anisotropic in one or two or three dimensions.

Still another embodiment is a two-dimensional BNS material.

Still another embodiment is a superlattice of two-dimensional BNS material layers and other material layers.

Still another embodiment is a BNS material with at least one of the interpenetrating networks forming wave guiding structures in one or two or three dimensions.

Still another embodiment is a BNS material with at least one of the interpenetrating networks having ferroelectric properties.

Still another embodiment is a BNS material with at least one of the interpenetrating networks having piezoelectric properties.

Still another embodiment is a BNS material with at least one of the interpenetrating networks having magnetic properties.

Still another embodiment is a BNS material with at least one of the interpenetrating networks having photoconductive properties with light sensitivity in a designated frequency range.

Still another embodiment is a material having regular or irregular inclusions of a BNS material.

Some of BNS interpenetrating networks might reach the BNS surface in one, or two, or three dimensions.

The nanocrystals used in a BNS might have different shapes ranging from spherical to highly asymmetric (e.g., platelets).

The nanocrystals used in a BNS could range in dimensions from 3 nm to 200 nm.

The network with nanoscale dimension used in a BNS could have one dimension in the range of 1 nm to 200 nm.

In other embodiments, the present invention provides a bipolar nanocomposite semiconductor solid, which consists of strongly electronically coupled nanoscale networks with p- and n-type conductivity.

In other embodiments, the present invention provides a bipolar nanocomposite semiconductor solid in which strongly electronically coupled p- and n-type conductive 3D nanoscale networks form a 3D distributed p-n junction.

In other embodiments, the present invention provides a bipolar nanocomposite semiconductor solid with a distributed p-n junction area of $>10^7$ m$^2$/m$^3$ regardless of macroscopic dimensions.

Although these particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for forming a bipolar nanocomposite semiconductor (BNS) material, the method including steps of:
    making or selecting a nanopowder comprising nanoparticles having a core/shell structure of materials $X_1/X_2 \ldots X_N$, each of the core/shell nanoparticles having a core of a first material $X_1$ and at least one shell of an additional material $X_2 \ldots X_N$, $X_N$ being an external material for each nanoparticle and having a corresponding p- or n-type conductivity OXN;
    making a nanoparticle network compact from the $X_1/X_2 \ldots X_N$ nanoparticles, the compact having an open porosity allowing permeation of the compact with gas or liquid;
    infilling and conformally coating all available surfaces inside the porous compact made from the $X_1/X_2 \ldots X_N$ nanoparticles with a material $Y_1$ having p- or n-type conductivity $\sigma_{Y1}$ opposite to the conductivity type of the material $X_N$ to form a nanocomposite material comprising the $X_1/X_2 \ldots X_N$ nanoparticles coated with $Y_1$; and
    sintering the formed nanocomposite material to remove residual porosity, intimately connect n- and p-type domains of the materials $X_N$ and $Y_1$, and form strong chemical bonds between the materials $X_N$ and $Y_1$ at all interfaces between materials $X_N$ and $Y_1$;
    wherein the n- and p-type domains comprising the materials $X_N$ and $Y_1$ are interconnected throughout the BNS material to form a three-dimensional network of p-n junctions such that electrons and/or holes are transported throughout the BNS material via their respective transport channels throughout the BNS material in a predefined manner.

2. The method according to claim 1, further comprising pressing the nanopowder of $X_1/X_2 \ldots X_N$ nanoparticles to form a green compact.

3. The method according to claim 2, further comprising partially sintering the porous compact to form strong chemical or metallic bonds between the $X_1/X_2 \ldots X_N$ nanoparticles while preserving an open porosity in the porous compact.

4. The method according to claim 1, further comprising partially sintering the nanopowder of $X_1/X_2 \ldots X_N$ nanoparticles to form the porous compact, the porous compact having strong chemical or metallic bonds between the $X_1/X_2 \ldots X_N$ nanoparticles while preserving an open porosity in the porous compact.

5. The method according to claim 1, wherein the step of infilling and conformally coating all available surfaces inside the porous compact of material $X_1/X_2 \ldots X_N$ with a material $Y_1$ is interrupted while the compact retains an open porosity and the step of infilling is repeated with a material $Y_2$.

6. The method according to claim 1, further comprising infilling and conformally coating all available surfaces inside the porous compact with materials $Y_1, Y_2, \ldots, Y_N$ while the compact retains an open porosity.

7. The method according to claim 6, wherein all available surfaces inside the porous compact are infilled with materials $Y_1, Y_2, \ldots, Y_N$ by means of atomic layer deposition.

8. The method according to claim 1, wherein the $X_1/X_2/\ldots/X_N$ core/shell nanoparticles are made by means of particle atomic layer deposition.

9. The method according to claim 1, wherein all processing steps are conducted in a controlled atmosphere with air-free transfer between steps to provide clean interfaces within the bipolar nanocomposite semiconductor.

10. The method according to claim 1, wherein the nanopowder comprises nanoparticles having a particle size of about 3 nm to about 500 nm.

* * * * *